United States Patent
Kuo et al.

(10) Patent No.: US 7,474,562 B2
(45) Date of Patent: Jan. 6, 2009

(54) METHOD OF FORMING AND OPERATING AN ASSISTED CHARGE MEMORY DEVICE

(75) Inventors: Ming-Chang Kuo, Hsinchu (TW); Chao-I Wu, Hsinchu (TW); Ming-Hsin Lee, Hsinchu (TW); Tzu-Hsuan Hsu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/292,024

(22) Filed: Dec. 1, 2005

(65) Prior Publication Data

US 2006/0146603 A1 Jul. 6, 2006

Related U.S. Application Data

(60) Provisional application No. 60/633,415, filed on Dec. 7, 2004.

(51) Int. Cl.
*G11C 11/34* (2006.01)
(52) U.S. Cl. ............................ 365/185.18; 365/185.28; 365/185.29
(58) Field of Classification Search ............. 365/185.18
See application file for complete search history.

(56) References Cited

U.S. PATENT DOCUMENTS

| 6,011,725 | A | 1/2000 | Eitan | |
|---|---|---|---|---|
| 6,744,675 | B1* | 6/2004 | Zheng et al. | 365/185.28 |
| 6,888,739 | B2* | 5/2005 | Forbes | 365/149 |

OTHER PUBLICATIONS

C.C. Yeh et al. "A novel low power program/erase, small pitch, 2-bit per cell flash memory," IEDM Technical Digest, 2002, 931-934.
Jan Van Houdt et al. "Analysis of the Enhanced Hot-Electron Injection in Split-Gate Transistors Useful for EEPROM Applications," IEEE Transactions on Electron Devices, vol. 39, No. 5, May 1992, 1150-1156.

* cited by examiner

*Primary Examiner*—Hoai V Ho
*Assistant Examiner*—Anthan T Tran
(74) *Attorney, Agent, or Firm*—Jianq Chyun IP Office

(57) ABSTRACT

A method is provided of forming an assisted charge memory (AC-memory) cell. The method uses a two-sided charge trap memory cell that includes a two-sided charge trapping layer. A charge is formed in at least a portion of the two-sided charge trapping layer. One side (AC-side) of the two-sided charge trapping layer always has a fixed high threshold voltage (Vt) level which is the assisted charge for the AC-memory cell. The other side (data-side) is used for memory operations.

8 Claims, 13 Drawing Sheets

One-side CHE injection

Compare different AC level with ΔVt shot=0.1us ΔVt is Data-side Vt difference of program and erase state Hybrid AC-Memory 10K cycle Hybrid AC-Memory RT drift 1000S with Vg=Vd=0V Hybrid AC-Memory Vg stress 1000s with Vg=-5V
High Vt charge loss 700mV

METHOD OF FORMING AND OPERATING AN ASSISTED CHARGE MEMORY DEVICE

CROSS-REFERENCE TO RELATED APPLICATIONS

This application claims the benefit of U.S. Provisional Application No. 60/633,415 filed Dec. 7, 2004, entitled "Assisted Charged Nitride-Trap Memory Device and its Operation."

BACKGROUND OF THE INVENTION

Nonvolatile memory (NVM) refers to a semiconductor memory that is able to continuously store information (e.g., data) even when the supply of electricity is removed. NVM includes Mask Read-Only Memory (Mask ROM), Programmable Read-Only Memory (PROM), Erasable Programmable Read-Only Memory (EPROM) and Electrically Erasable Programmable Read-Only Memory (EEPROM). Typically, the NVM is programmed with data that can also be stored for a long period of time and can be read, erased and re-programmed many times.

Traditional EPROM Tunnel Oxide (ETOX) and Nitride Trapping Read Only Memory (NROM) use Channel Hot Electron (CHE) injection to program the memory cell to a high threshold voltage (Vt) level. To quickly program a memory cell by using the Channel Hot Electron (CHE) injection, a large programming current is required because CHE has a poor programming efficiency. As a result, the memory cell programming speed is limited due to its high-power consumption.

Another example is Programming by Hot Hole Injection Nitride Electron Storage (PHINES) cell, which uses Band-to-Band Hot Hole (BTBHH) injection to program the cell to a low threshold voltage (Vt) level. However, the BTBHH injection is very slow and needs a longer programming time to program the cell. This limits the cell programming speed, thereby making the PHINES cell inefficient.

To address these deficiencies, a memory cell is provided that has an assisted charge (AC) in the charge-trap layer of a memory device (AC-memory). The assisted charge improves the overall operational efficiency and speed for the nitride-trapping memory cell in the AC-memory device.

BRIEF SUMMARY OF THE INVENTION

One preferred embodiment of the present invention forms an Assisted Charge memory (AC-memory) cell in a charge-trap AC-memory device for storing data and performing memory operations. The AC-memory cell has a p-type substrate, a source region and a drain region that are formed in a portion of the substrate. A channel is interposed between the source and drain regions in a portion of the substrate, and a first dielectric layer is formed on the substrate above the channel. The AC-memory further includes a two-sided (i.e., AC-side and data-side) charge trapping layer, which is formed on the first dielectric layer. A second dielectric layer is formed on the charge trapping layer and a control gate is formed above the second dielectric layer. Additionally, the data side of the charge trapping layer can be operated as a Multi-Level cell, in which the data side can have charges that have a varying degree of levels that represent different threshold voltage (Vt) levels.

To prepare the cell for forming the charge, a ground potential is supplied to at least one of the source region or the drain region. An operation voltage (e.g., bias potential) is then supplied to at least one of the source region or the drain region and a control voltage is supplied to the control gate. The charge is formed in at least a portion of the charge trapping layer of the AC-memory cell. The side that stores the charge is the AC-side of the two-sided charge trapping layer and always has a fixed high threshold voltage (Vt) level, which is the assisted charge for the AC-memory cell. The other side of the two-sided charge trapping layer is the data-side that is used for storing data and performing memory operations.

The AC-side of the AC-Memory cell is fixed at a high threshold voltage (Vt) level by trapping the assisted charge in the charge trapping layer. The data-side is used to store the data, which can be at any threshold voltage level according to the memory operations. The memory operations include programming, reading and erasing. By having the assisted charge fixed at a high threshold voltage (Vt) level in the AC-side, an abrupt electrical field exists between the AC-side and the data-side. The abrupt electrical field enhances the programming efficiency of the AC-memory cell for the AC-memory device. The fixed high threshold voltage (Vt) level of the AC-side limits the programming current needed during a Hot Electron (HE) program operation on the AC-memory. As a result, the charge trap AC-memory cell achieves a low programming power requirement and thus has a higher programming efficiency and a greater speed.

Preferred embodiments for the AC-memories of the present invention include Channel Hot Electron (CHE AC-memory), Fowler-Nordheim (FN AC-memory) and Hybrid AC-Memory.

To form a CHE AC-memory, Channel Hot Electron injection is used on one side of the AC-memory cell (AC-side) to increase it to a fixed high threshold voltage (Vt) while keeping the other side (data-side) of a two-sided memory cell at low threshold voltage (Vt).

To form an FN AC-memory, either positive FN injection (+FN) or negative FN injection (−FN) is used to program the entire charge trapping layer. FN injection is used by applying a positive or a negative bias between the gate and substrate to uniformly increase the threshold voltage (Vt) of the entire charge trapping layer of the AC-memory cell. To complete the forming of the FN AC-memory cell, Band-to-Band Hot-Hole (BTBHH) injection is used to decrease the data-side to a low threshold voltage while maintaining the assisted charge in the AC-side at a fixed high threshold voltage. After using BTBHH, the data-side is now prepared for storing data. The data can be at any threshold voltage level.

To form a Hybrid AC-memory, Channel Hot Electron (CHE) is used to bring the AC-side to a very high threshold voltage (Vt) level. Band-to-Band Hot-Hole (BTBHH) injection is then used on the other side (data-side) of the two-sided AC-memory cell to decrease the data-side to a low threshold voltage (Vt) level, which can have any threshold voltage (Vt) level for storing data.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
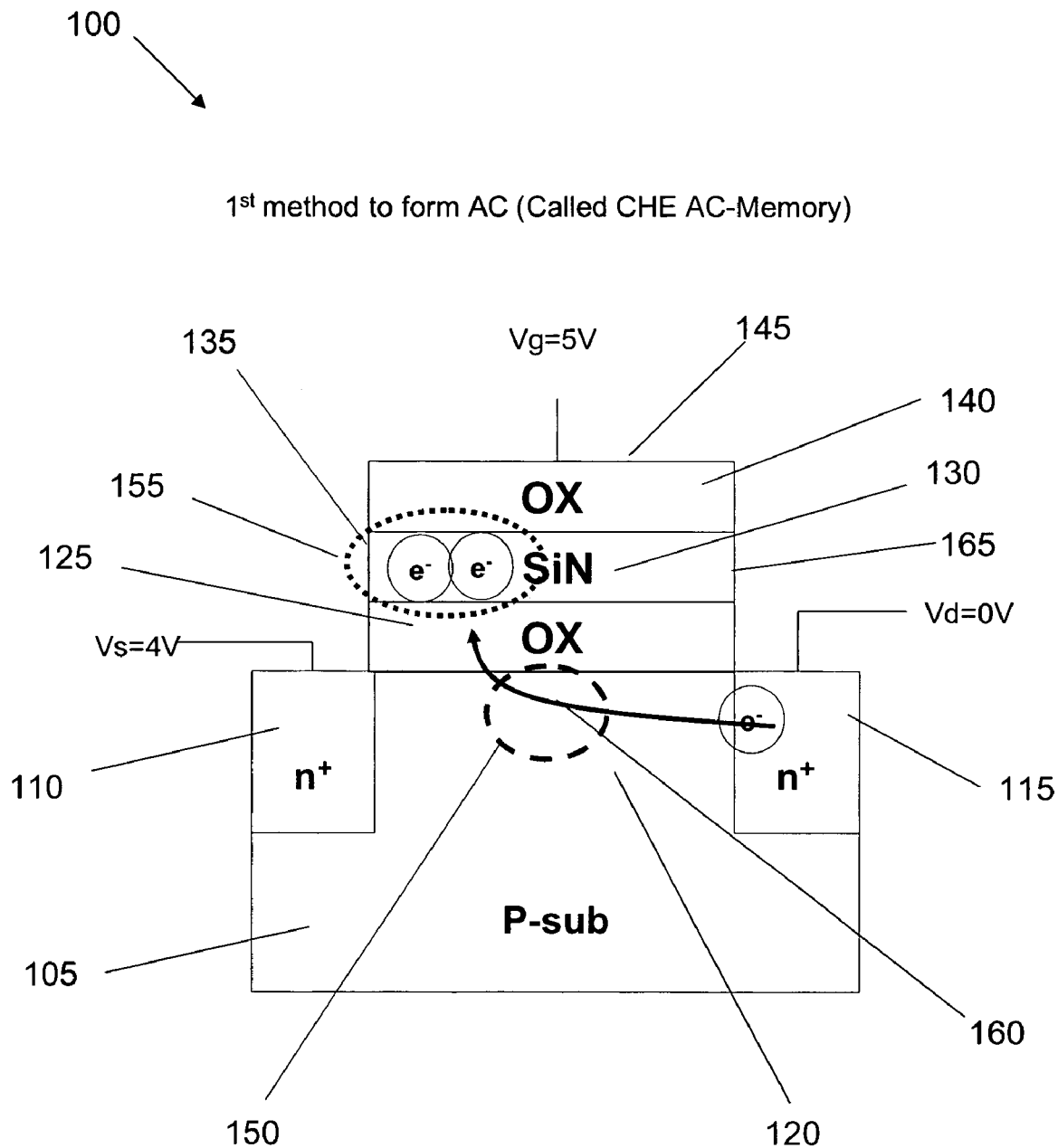
FIG. 1 is a schematic diagram showing a structure and an exemplary method for forming an AC-Memory using one-side Channel Hot Electron (CHE) injection in accordance with a preferred embodiment of the present invention.

Referring to the drawings in detail, wherein like reference numerals indicate like elements throughout, FIG. 1 shows a preferred embodiment of an AC-memory cell 100 in accordance with the present invention. The AC-memory cell 100 has a p-type substrate 105 with a source region 110, a drain region 115 and a channel 120 that is interposed between the source 110 and drain 115 regions, which is in a portion of the substrate 105. The cell also includes a first dielectric layer 125 that is on the substrate 105 and above the channel 120, and a two-sided charge trapping layer 130 that is on the first dielectric layer 125. There is a second dielectric layer 140 on the charge trapping layer 130 and a control gate 145 above the second dielectric layer 140. The preferred embodiments of the present invention use an oxide for the first and second dielectric layers, but other dielectric materials could be used for either the first or second dielectric layers. The preferred embodiments also use silicon-nitride for the charge trapping layer, but other localized trapping materials, such as nanocrystal, could be used in place of, or in combination with, the silicon-nitride.

To form a CHE AC-memory cell, the drain region 115 is supplied with a ground potential (e.g., Vd=0V), the source region 110 is supplied with a bias potential voltage of Vs=4V and the control gate 145 is supplied with a bias potential voltage of Vg=5V.

Using one-side Channel Hot Electron (CHE) injection on the AC-side 135, the AC-side 135 is increased to a high threshold voltage (Vt) level while the data-side 165 remains at a low threshold voltage (Vt). An abrupt electrical field 150 region is created between the AC-side 135 and the data-side 165 in the channel 120 between the drain 115 and source 110 regions, thereby forming the CHE AC-memory 100.

The one-side Channel Hot Electron (CHE) injection is used to form an assisted charge 155 in the AC-side 135 by creating a pathway 160 from the drain region 115 through the channel 120 and the first oxide layer 125 to the AC-side 135. The pathway 160 provides a conduction path for the assisted charge 155 from the drain 115 to the AC-side 135 of the charge trapping layer 130. The assisted charge 155 is stored in the AC-side 135 and is always kept at a fixed high threshold voltage (Vt) level. The other side of the charge trapping layer is the data-side 165, which remains at a low threshold voltage (Vt) and can have any threshold voltage level, which is used to store data and perform memory operations. With the assisted charge 155 fixed at a high threshold voltage (Vt) level, there is an abrupt electrical field 150 that exists between the AC-side 135 and the data-side 165 of the memory cell 100. The abrupt electrical field 150 enhances the programming efficiency and the speed of the data-side during memory operations. The memory operations include programming, erasing and reading of the data in the data-side 165 of the memory cell 100. In addition, the existence of the fixed assisted charge 155 in the AC-side 135 limits the programming current during a Hot Electron (HE) programming operation, thereby reducing the power requirements and making the programming more efficient.

Figure 2A:
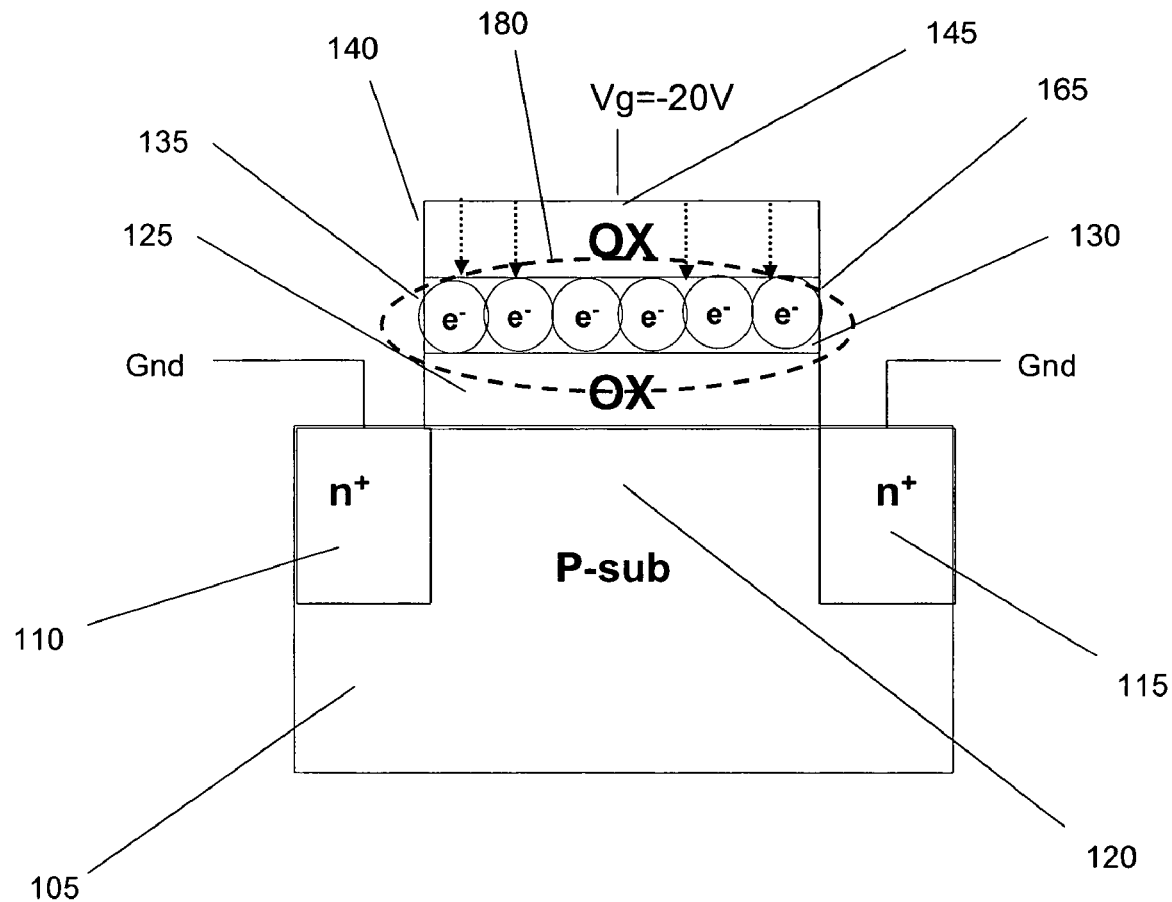
FIG. 2A is a schematic diagram showing an exemplary method for forming a Fowler-Nordheim (FN) AC-Memory by filling a trapping layer with a FN charge in accordance with another preferred embodiment of the present invention.
Figure 2B:
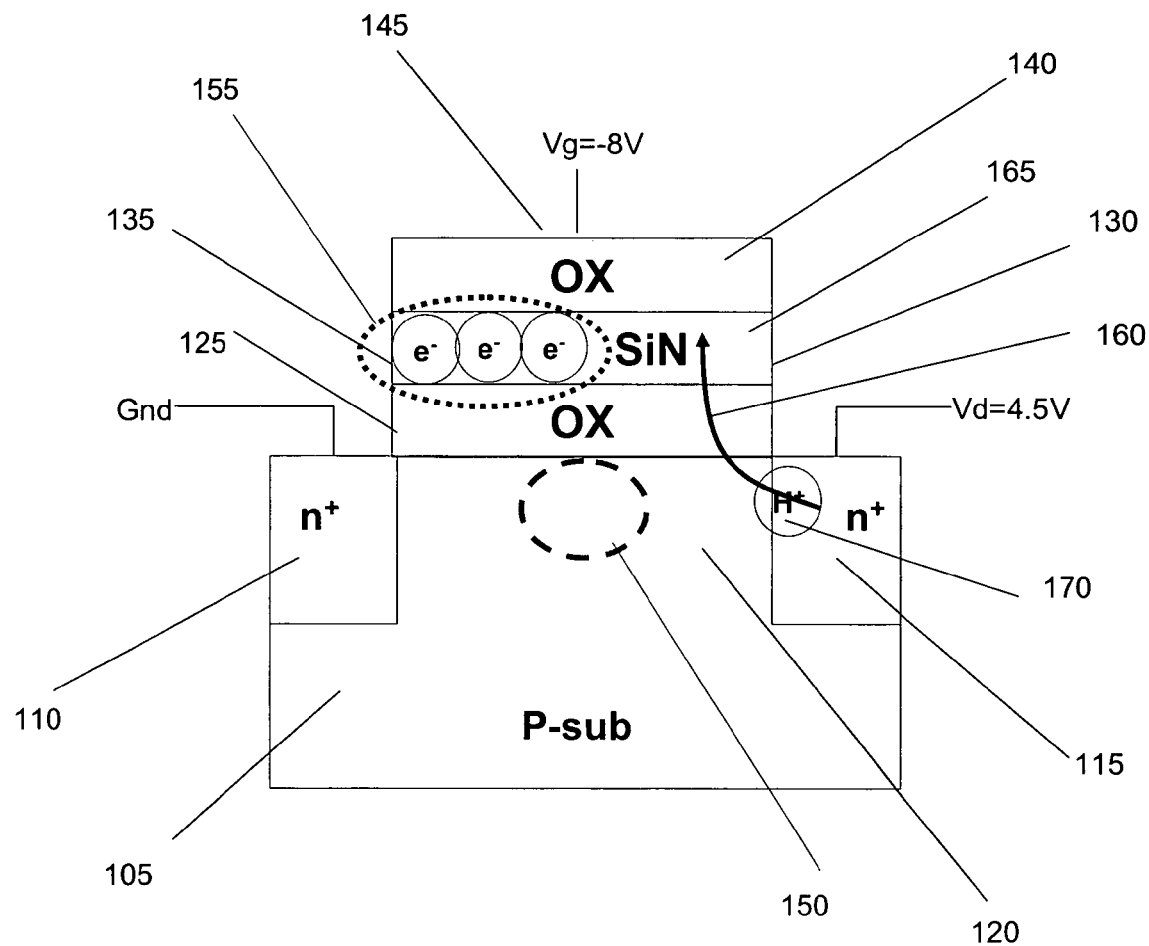
FIG. 2B is a schematic diagram showing an exemplary method for erasing a portion of the trapping for completing the forming of the Fowler-Nordheim (FN) AC-Memory using one-side Band-to-Band Hot-Hole (BTBHH), as illustrated in FIG. 2A.

FIGS. 2A and 2B are schematic views of an FN AC-memory 200 in accordance with another preferred embodiment of the present invention. FIGS. 2A and 2B illustrate a two-step process for forming the FN AC-memory 200 cell using the same memory cell 100 structure as shown in FIG. 1. To form the FN AC-memory 200 cell, both the drain 115 and source 110 regions are supplied with a ground potential (e.g., Vd=Vs=0V) and the control gate 145 is biased with a Vg=−20V potential as shown in FIG. 2A. Negative Fowler-Nordheim (−FN) injection is used by applying a negative bias between the control gate 145 and the substrate 105 to uniformly increase the threshold voltage (Vt) of the charge trapping layer 130 of the memory cell 100. This creates an FN charge 180 that occupies the entire charge trapping layer 130 of the FN AC-memory cell 200. The data-side 165 is formed by using one-side Band-to-Band Hot-Hole injection to erase the FN charge 180 from the data-side 165. At the same time, the FN charge 180 in the AC-side 135 is maintained at a fixed high threshold voltage (Vt) level as shown in FIG. 2B.

Before using the BTBHH injection, the source 110 region is supplied with a ground potential (Vs=0V), and the drain 115 region is supplied with Vd=4.5V bias potential voltage. The control gate 145 bias potential voltage is changed to Vg=−8V as shown in FIG. 2B. The Band-to-Band Hot-Hole (BTBHH) injection is used for erasing one side 165 (e.g., data-side) of the two-sided charge trapping layer 130 of the memory cell while maintaining the other side 135 (AC-side) at a fixed high threshold voltage (Vt) level.

By using the BTBHH injection, a pathway 160 is created from the drain 115 region through the channel 120 and the first oxide layer 125 to the data-side 165 of the charge trapping layer 130. The pathway 160 allows a hole carrier charge 170 to conduct to the data-side 165 and erases the FN charge 180 that was placed there by the FN injection. The erasing only clears the data-side 165 and keeps the AC-side 135 fixed at a high threshold voltage (Vt) level. With the assisted charge 155 fixed at a high threshold voltage (Vt) level, the abrupt electrical field 150 is created between the AC-side 135 and the data-side 165 of the memory cell 200, as shown in FIG. 2B. The abrupt electrical field 150 enhances the programming efficiency and the speed of the data-side 165 during a memory operation. The memory operation includes programming, erasing and reading the data stored in the data-side 165 of the memory cell 100, 200, 300. The presence of the assisted charge 155 at a high threshold voltage (Vt) level in the AC-side 135 limits the programming current during a Hot Electron (HE) programming operation. This reduces the programming power requirements and makes programming the FN AC-memory more efficient.

Another preferred embodiment of the present invention uses Positive Fowler-Nordheim (+FN) injection to form the FN AC-memory 200 cell as shown in FIG. 2A. Positive Fowler-Nordheim (+FN) injection is used by applying a positive bias voltage between the control gate 145 and the substrate 105. The +FN injection uniformly increases the threshold voltage (Vt) level of the charge trapping layer 130 of the memory cell 200. This technique creates an FN charge 180 that occupies the entire charge trapping layer 130 of the FN AC memory cell 200. The BTBHH injection as used above for the −FN injection can also be used to erase the FN charge 180 that occupies the data-side 165 of the +FN AC-memory cell 200.

To form the +FN AC-memory cell, the drain 115 region is supplied with a bias potential voltage and the control gate 145 is changed to a different control voltage as shown in FIG. 2B. Band-to-Band Hot-Hole (BTBHH) injection is used for erasing one side 165 (data-side) of the two-sided charge trapping layer of the memory cell while maintaining the other side 135 (AC-side) at a high threshold voltage (Vt) level. The abrupt electrical field 150 region is created between the AC-side 135 and the data-side 165 in the channel 120 between the drain 115 and source 110 regions, thereby forming an FN AC-memory 200.

Figure 3A:
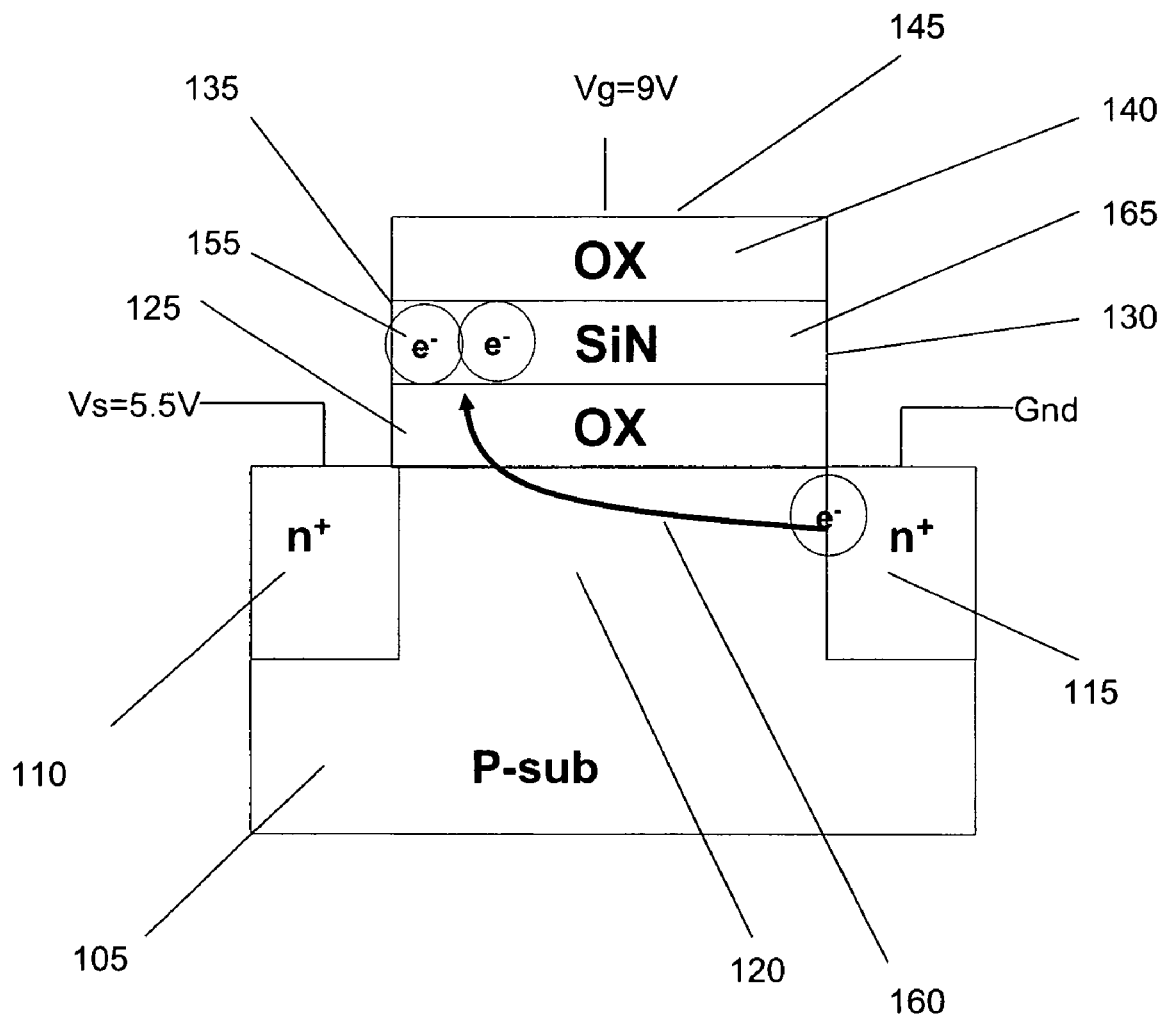
FIG. 3A is a schematic diagram showing an exemplary method for forming a Hybrid AC-Memory using one-side Channel Hot Electron (CHE) at the AC-side of the AC-Memory in accordance with another preferred embodiment of the present invention.
Figure 3B:
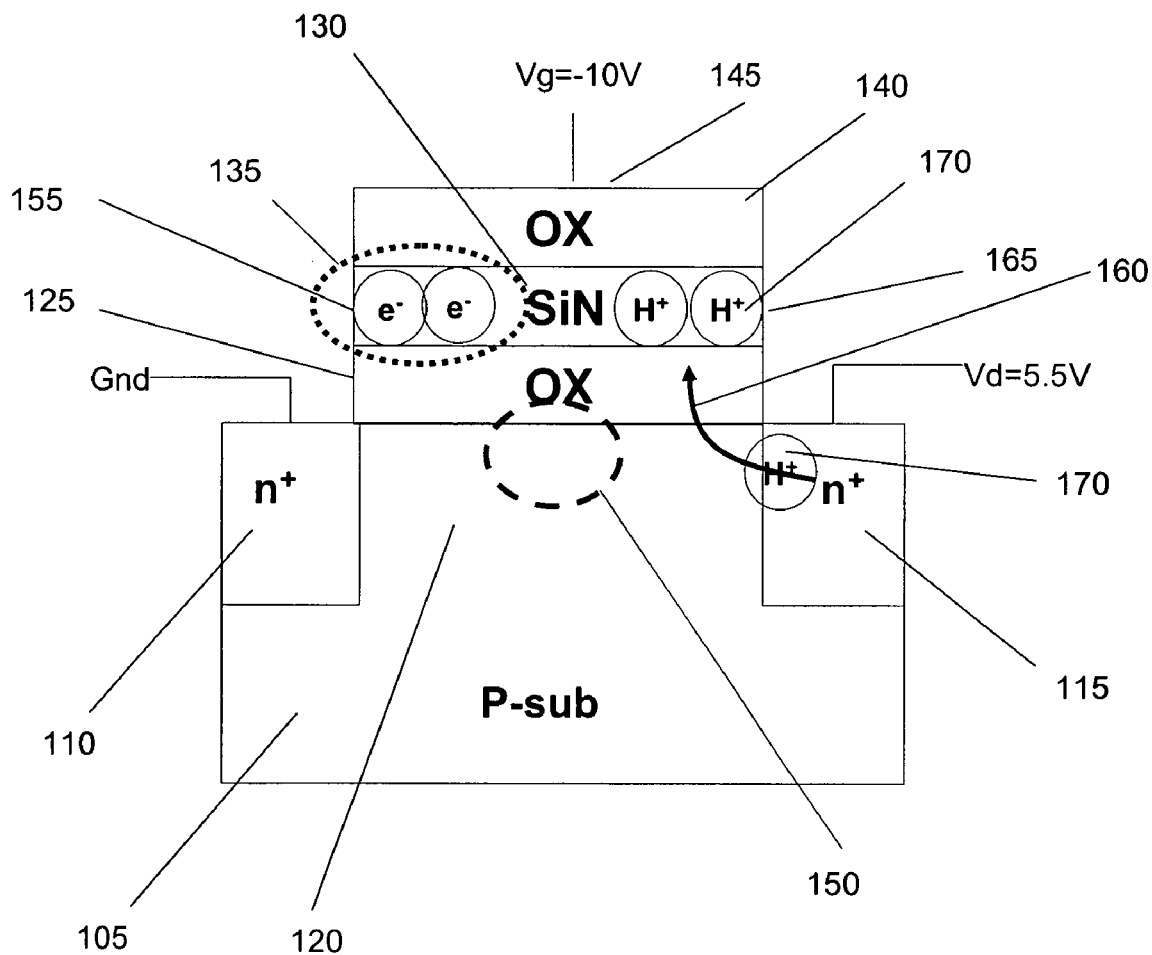
FIG. 3B is a schematic diagram showing an exemplary method for erasing a Hybrid AC-Memory using one-side Band-to-Band Hot-Hole (BTBHH) for the data-side in accordance with FIG. 3A.

FIGS. 3A and 3B are schematic views of a Hybrid AC-memory 300 in accordance with another preferred embodiment of the present invention. FIGS. 3A and 3B illustrate a two-step process for forming the Hybrid AC-memory 300 cell using the same memory cell structure as shown in FIG. 1. To form the Hybrid AC-memory 300 cell, the source 110 region is supplied with a bias potential voltage of Vs=5.5V, the drain 115 region is supplied with a ground potential (e.g., Vd=0V) and the control gate 145 is supplied with a bias potential voltage of Vg=9V as shown in FIG. 3A. By using one-side Channel Hot Electron (CHE) injection on the AC-side 135, the AC-side 135 increases to a high threshold voltage (Vt) level while the data-side 165 remains at a low threshold voltage (Vt).

FIG. 3A shows the one-side Channel Hot Electron (CHE) injection being used to form an assisted charge 155 in the AC-side 135 by creating a pathway 160 from the source 110 region through the channel 120 and the first oxide layer 125 to the AC-side 135. The pathway 160 provides a conduction path for the assisted charge 155 to occupy the AC-side 135 of the charge trapping layer 130 of the Hybrid AC-memory 300 cell. After using the Channel Hot Electron (CHE) injection, the drain 115 region is supplied with a bias potential of Vd=5.5V, the source 110 region is supplied with a ground potential (e.g., Vs=0V) and the control gate 145 is changed to a bias potential of Vg=−10V, as shown in FIG. 3B. Referring to FIG. 3B, the one-side Band-to-Band Hot-Hole (BTBHH) injection is used to erase the data-side 165 of the two-sided charge trapping layer 130 while keeping the AC-side 135 at a fixed high threshold voltage (Vt) level. The abrupt electrical field 150 region is created between the AC-side 135 and the data-side 165 in the channel 120 between the drain 115 and source 110 regions, thereby forming a Hybrid AC-memory cell 300. The data-side 165 of the charge trapping layer 130 remains at a low threshold voltage (Vt) and can have any threshold voltage level and is used to store a data charge.

Since the AC-side 135 has the assisted charge 155 fixed at a high threshold voltage (Vt) level, the abrupt electrical field 150 is created between the AC-side 135 and the data-side 165 of the Hybrid AC-memory cell 300, as shown in FIG. 3B. The abrupt electrical field 150 enhances the programming efficiency and the speed of the data-side 165 during memory operations. The memory operations include programming, erasing and reading of the data charge stored in the data-side 165 of the Hybrid AC-memory 300 cell. The assisted charge 155 in the AC-side 135 limits the programming current during the Hot Electron (HE) programming operation. Since the current is limited, this reduces the programming power requirement and makes the programming more efficient.

Figure 4A:
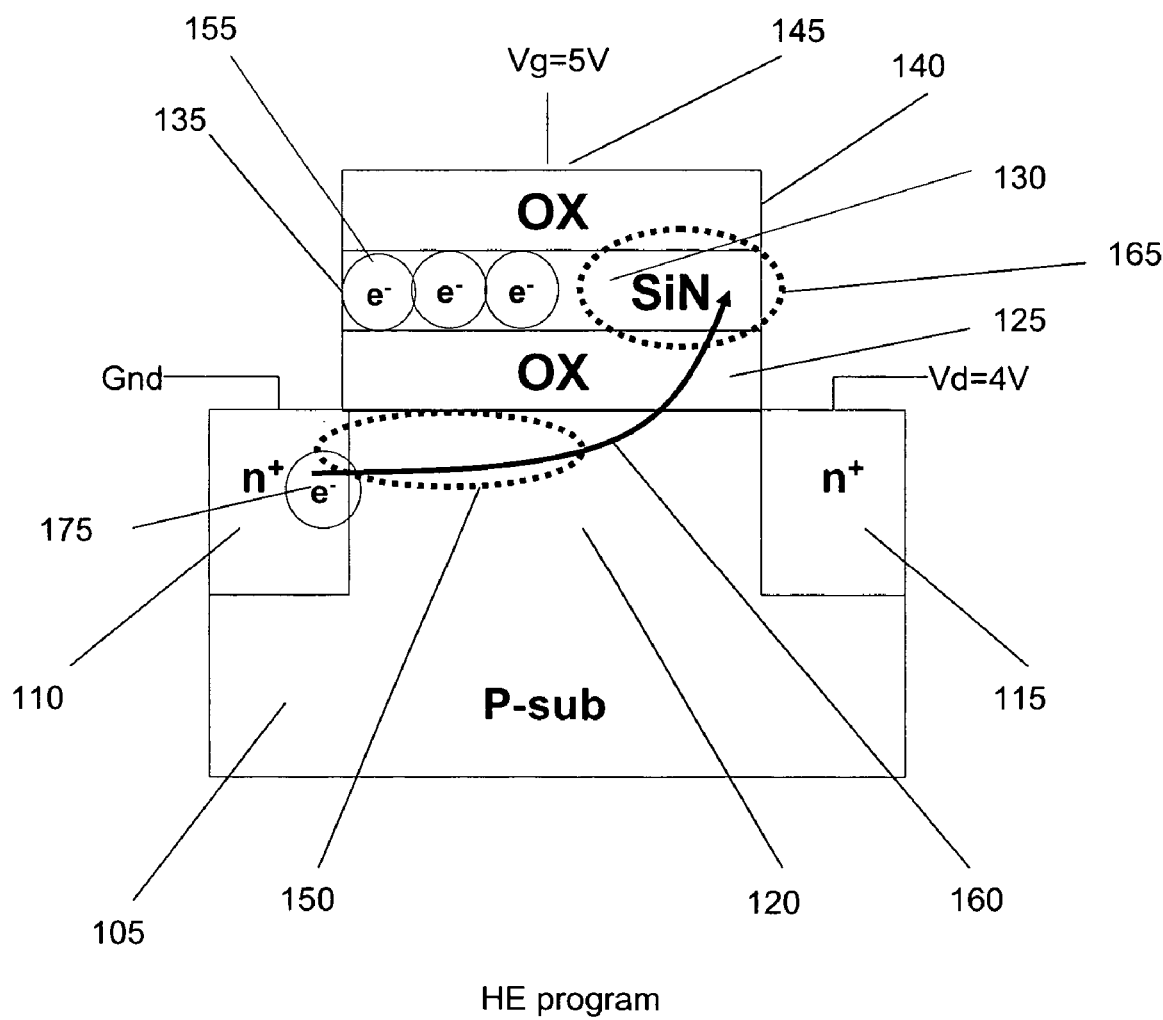
FIG. 4A is a schematic diagram of an exemplary method for a program operation at the data-side using Hot Electron (HE) programming of the AC-Memory for the embodiments of FIGS. 1-3.

FIG. 4A is a schematic view of the AC-memory cell 100, 200, 300 of FIGS. 1-3 showing the Hot Electron (HE) injection for programming the AC-memory cell 100, 200, 300. The AC-memory cell 100, 200, 300 is set up with the source 110 region supplied with a ground potential (Vs=0V), the drain 115 region supplied with a bias potential voltage of Vd=4V, and the control gate 145 supplied with a bias potential voltage of Vg=5V. Before programming the data-side 165, the AC-side 135 is set to a fixed high threshold voltage (Vt) level when the AC-memory cell 100, 200, 300 was formed, which is used as a current limited region. The AC-side 135 is set at a fixed high threshold voltage level. HE injection is then used to program the AC-memory cell 100, 200, 300. An abrupt electrical field 150 is created between the data-side 165 and the AC-side 135, which aids in programming of the data-side 165. A pathway 160 is created from the source region through the abrupt electric field 150 in the channel 120 and the first dielectric layer 125 to the data-side 165 of the charge trapping layer 130. The Hot Electron (HE) programming causes a data charge 175 to conduct from the source 110 region through the abrupt electric filed 150 in the channel 120, through the first dielectric 125 (e.g., oxide) layer, and is stored in the data-side 165 of the AC-memory cell 100, 200, 300, as shown in FIG. 4A. The abrupt electrical field 150 enhances the programming efficiency and speed of the AC-memory cell 100, 200, 300. Since the AC-side 135 is fixed at a high threshold voltage (Vt) level, it creates a current limited region in which the HE programming needs less current to program the data-side 165, thereby reducing the power consumption of the AC-memory cell 100, 200, 300. Since the assisted charge 155 limits the programming current for the AC-memory, there is no over-programming problems associated with any of the embodiments and a tight program state distribution is provided in the AC-memory cells.

Figure 4B:
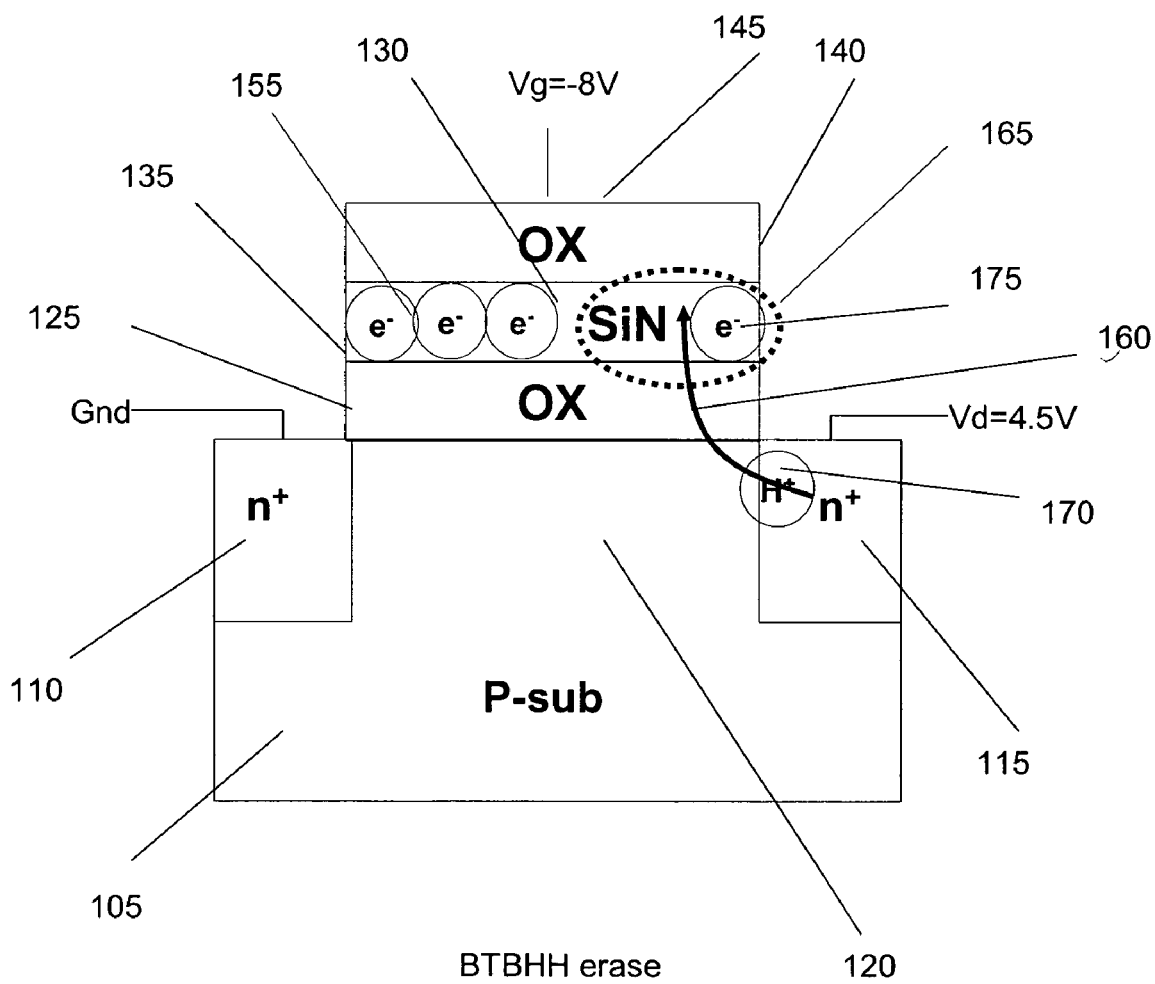
FIG. 4B is a schematic diagram of an exemplary method for an erase operation at the data-side using Band-to-Band Hot-Hole (BTBHH) erasing of the AC-Memory for the embodiments of FIGS. 1-3.

FIG. 4B is a schematic view of the AC-memory cell 100, 200, 300 of FIGS. 1-3, which all have the same structure and show the Band-to-Band Hot-Hole (BTBHH) injection for erasing the data-side 165 of the AC-memory cell 100, 200, 300. The AC-memory 100, 200, 300 is set up with the source 110 region supplied with a ground potential (e.g., Vs=0V), the drain 115 region supplied with a bias potential voltage of Vd=4.5V, and the control gate 145 supplied with a bias potential voltage of Vg=−8V. A generally short pathway 160 that goes through the channel 120 and the first dielectric 125 (e.g., oxide) layer is created between the drain 115 region and the data-side 165. Band-to-Band Hot-Hole (BTBHH) injection is then used to erase the data-side 165 by injecting a hole carrier charge 170 that conducts from the drain 115 region by forming a pathway 160 through the channel 120 to the data-side 165 in the charge trapping layer 130 of the AC-memory cell 100, 200, 300.

Figure 5:
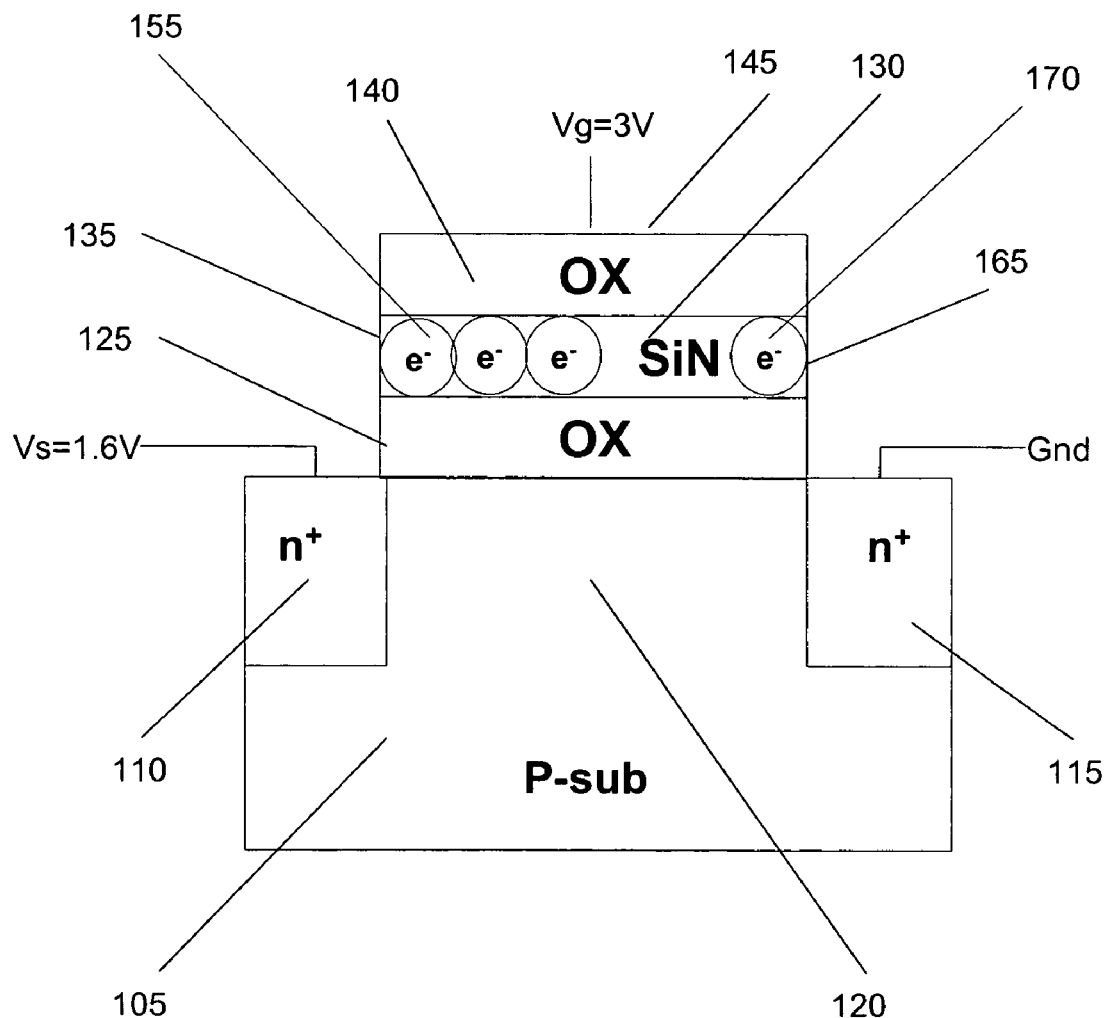
FIG. 5 is a schematic diagram showing an exemplary method for a read operation for the data-side of the AC-Memory (Vd is at the AC-side) for the embodiments of FIGS. 1-3.

FIG. 5 is a schematic view of the AC-memory cell 100, 200, 300 of FIGS. 1-3 illustrating a read operation with Vs on the AC-side 135 for all embodiments of the AC-memory cell 100, 200, 300. The AC-memory cell 100, 200, 300 is set up with the source 110 region supplied with a bias potential voltage of Vs=1.6V, a ground potential (e.g., Vd=0V) for the drain 115 region, and a bias potential voltage of Vg=3V for the control gate 145. Once the memory cell 100, 200, 300 is set up and properly biased, it is ready for the data to be read that is stored in the data-side 165 of the AC-memory 100, 200, 300. The read operation does not affect the assisted charge 155 that is set to a fixed high threshold voltage (Vt) level and is maintained in the AC-side 135. The assisted charge 155 in the AC-side 135 reduces the read disturbance of the AC-memory cell or device, which limits any read operation errors.

Figure 6:
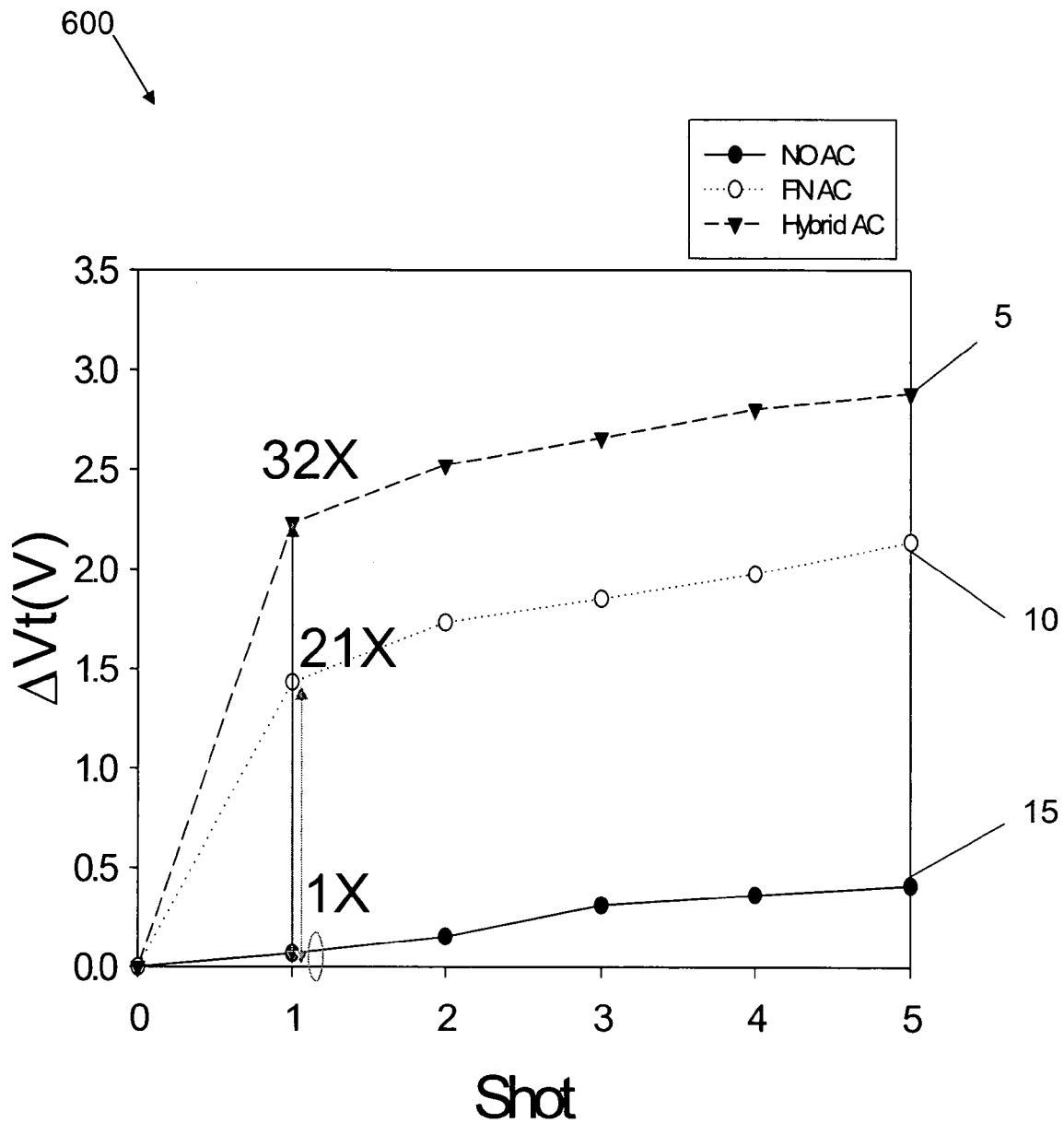
FIG. 6 is a graph showing experimental data that illustrates a programming speed comparison of the FN AC-Memory of the memory structure of FIG. 2 and the Hybrid AC-Memory of the memory structure of FIG. 3 when compared with a general charge memory structure.

The memory operations for the preferred embodiments require less operating current than a general charge trapping memory cell (e.g., non-AC-memory), thereby increasing the overall efficiency of the AC-memory 100, 200, 300. In addition, the speed of the AC-memory also increases and the lower current reduces the power consumption for the operation. Furthermore, all AC-memory embodiments can perform memory operations as a Multi Level Cell (MLC), in which the data-side of the charge trapping layer can have a varying degree of threshold voltage (Vt) levels to represent the stored data. FIG. 6 is a graph 600 showing experimental data comparing programming speeds and AC-levels of a general charge memory cell to the FN AC-memory 200 and the Hybrid AC-memory 300 cells of FIGS. 2 and 3. The graph 600 illustrates and compares different AC levels for each memory cell type with the graph comparing ΔVt(V) versus Shot, which is defined as ΔVt shot=0.1 μs. ΔVt(V) is the data-side Vt difference of the program and erase state for the memory cells. The general charge memory cell structure voltage biases are configured with the gate overdrive voltage set to Vg_od=0V, the control gate voltage set to Vg=2V, and the drain region voltage set to Vd=4.75V. Gate overdrive(Vg_od) means the voltage difference between gate voltage and the threshold voltage of AC-side. The general charge memory cell does not have an AC-side. Therefore, the AC-level=0V represents the threshold voltage (Vt) difference between the AC-side and the data-side of the memory cell. The data for the general charge memory cell is the bottom data curve 15 (labeled as 1X) that is illustrated on the graph 600 by the solid line with the black circles of FIG. 6.

The FN AC-memory 200 cell of FIG. 2 has an AC level that equals 2.4V due to the assisted charge 155 that is present in the AC-side 135 of the charge trapping layer 130. The gate overdrive voltage is Vg_od=0V with the control gate 145 voltage Vg=4.4V and the drain 115 region voltage Vd=4.75V. The FN AC-memory 200 cell is the middle data curve 10 (labeled as 21X) that is illustrated on the graph 600 by the dotted line with the white circles of FIG. 6. In comparison, both the positive and the negative FN AC-memory 200 cell is twenty-one times faster than the general memory cell due to the AC-level of 2.4V as illustrated in FIG. 6.

The Hybrid AC-memory 300 cell of FIG. 3 has an AC level that equals 2.9V due to the assisted charge 155 that is present in the AC-side 135 of the charge trapping layer 130. The gate overdrive voltage Vg_od=0V, the control gate 145 voltage Vg=4.9V, and the drain 115 region voltage Vd=4.75V. The Hybrid AC-memory 300 cell is the top data curve 5 (labeled as 32X) that is illustrated on the graph 600 by the dashed line with the black triangles of FIG. 6. In comparison, the Hybrid AC-memory 300 cell is thirty-two times faster than the general charge memory cell as illustrated in FIG. 6.

Figure 7:
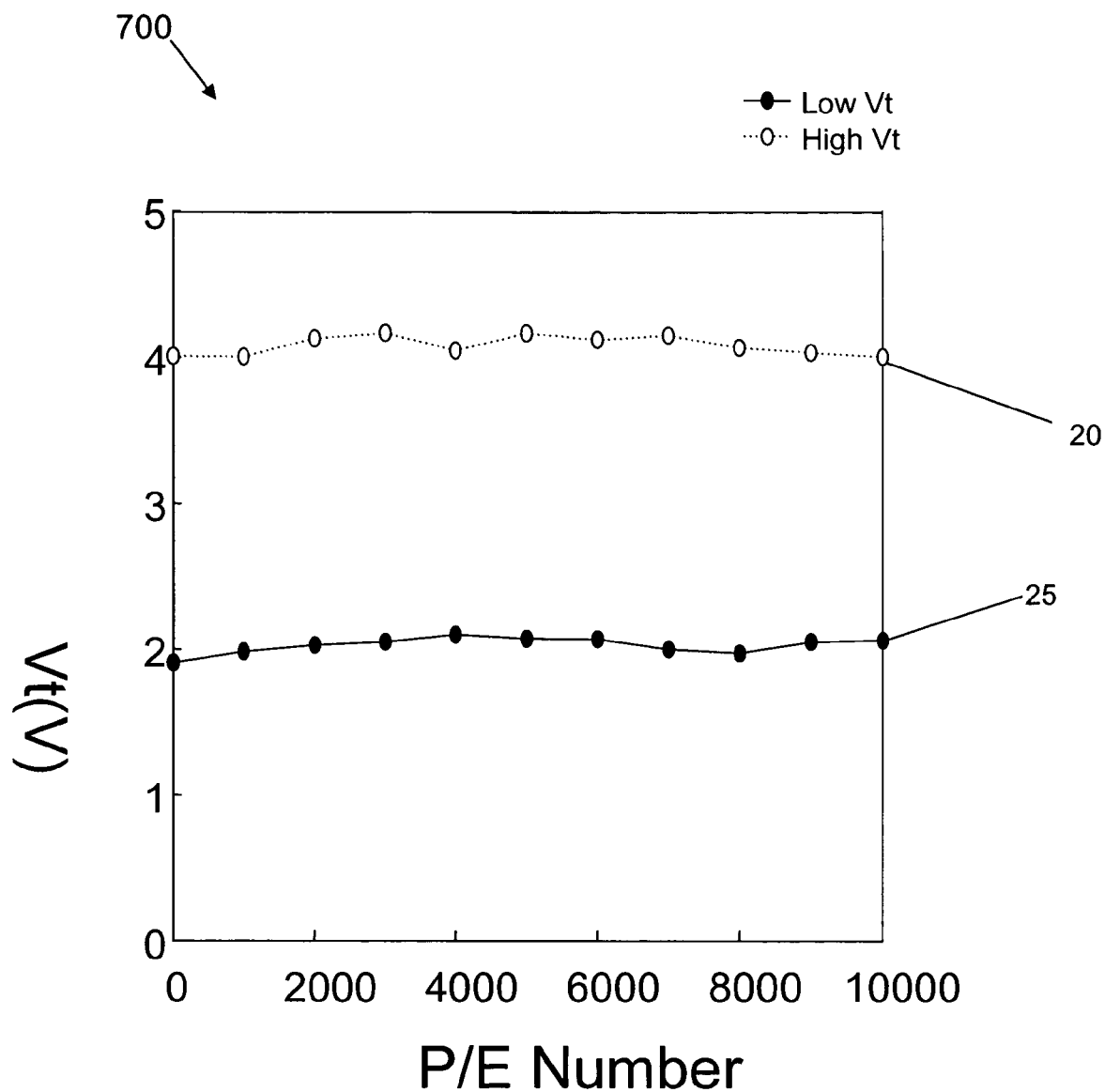
FIG. 7 is a graph showing experimental data that illustrates a voltage window for high and low threshold voltage states at the data-side during 10,000 P/E cycles (e.g., program/erase cycles) for the Hybrid AC-Memory cell for the memory structure of FIG. 3.

FIG. 7 is a graph 700 of experimental data that compares the threshold voltage (Vt) versus a P/E (e.g., program/erase) ratio of the Hybrid AC-memory 300 cell of FIG. 3 for a 10,000 program and erase cycle. The Hybrid AC-memory 300 cell had an initial AC-level of 3V. The AC level is the threshold voltage (Vt) difference between the AC-side 135 and the data-side 165 of the memory cell 300. During a program operation, the source 110 region was supplied with a ground potential (e.g., Vs=0V), the drain 115 region was supplied with Vd=4.75V, and the control gate 145 was supplied with a bias potential of Vg=5V. During an erase operation, the source 110 region was supplied with a ground potential (e.g., Vs=0V), the drain 15 region was supplied with Vd=4.5V and the control gate 145 was supplied with a bias potential of Vg=−8V. Data was collected for the 10,000 P/E cycles test to illustrate a threshold voltage (Vt) window, which is the area between 20 and 25 for high and low threshold voltage Vt states at the data-side 165 for the Hybrid AC-memory cell 300 of FIG. 3. The high threshold voltage state is the top data curve 20 and is illustrated by a dotted line with white circles. The low threshold voltage state is the bottom data curve 25 and is illustrated by a solid line with black circles on the graph 700 of FIG. 7. As a result, the high threshold state 20 remained at a threshold voltage of 4V and the low state 25 remained at a threshold voltage of approximately 1.9V. This kept the threshold voltage window generally the same size over the 10,000 P/E cycles for the Hybrid AC-memory cell 300 of FIG. 3.

Figure 8:
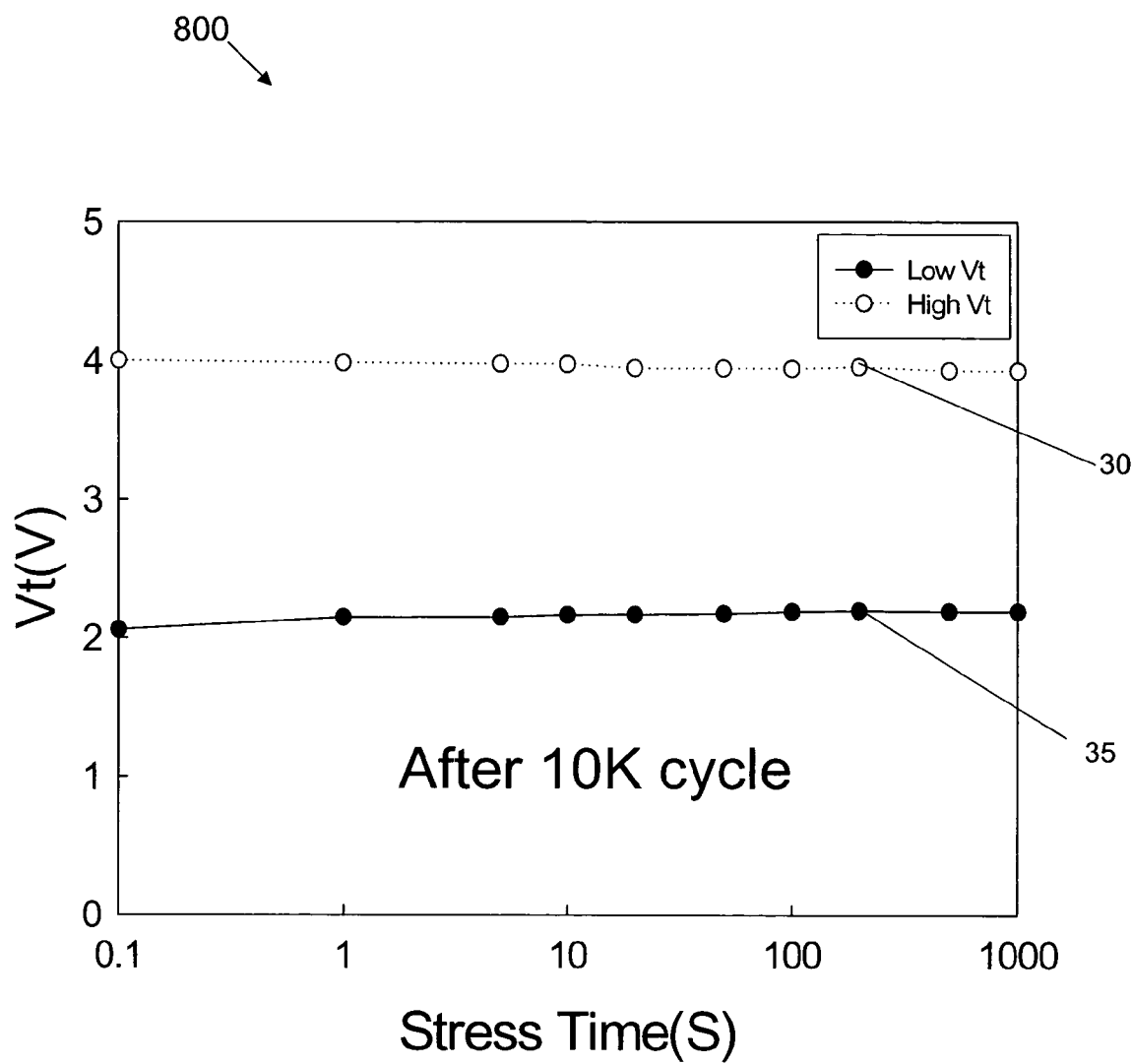
FIG. 8 is a graph showing experimental data that illustrates a room temperature (RT) voltage drift at the data-side of a 10K-cycled Hybrid AC-Memory for the memory structure of FIG. 3.

FIG. 8 is a graph 800 showing experimental data that compares a room temperature (RT) threshold voltage (Vt) drift versus a stress time and its effect on the data-side 135 after the 10,000 P/E cycle as shown in graph 700 of FIG. 7 for the Hybrid AC-memory cell 300 of FIG. 3. The Hybrid AC-memory cell 300 was configured with a ground potential on drain 115 region Vd=0V and the control gate 145 Vg=0 after completing the 10,000 P/E cycle of FIG. 7. The stress time was 1,000 seconds and data for the threshold voltage window was observed for the Hybrid AC-memory 300 cell. The high threshold voltage state is the top data curve 30 and is illustrated by a dotted line with white circles. The low threshold voltage is the bottom data curve 35 that is illustrates by a solid line with black circles on the graph 800 of FIG. 8. The high and low threshold voltage states illustrate the threshold voltage window for the Hybrid AC-memory 300 of FIG. 3. The graph shows the room temperature (RT) drift on the data-side 165 with almost no change between the high 30 and low 35 threshold voltage states over the 1,000 seconds stress time. This data illustrates that the Hybrid AC-memory 300 cell has very good data retention over many programming and erasing operations.

Figure 9:
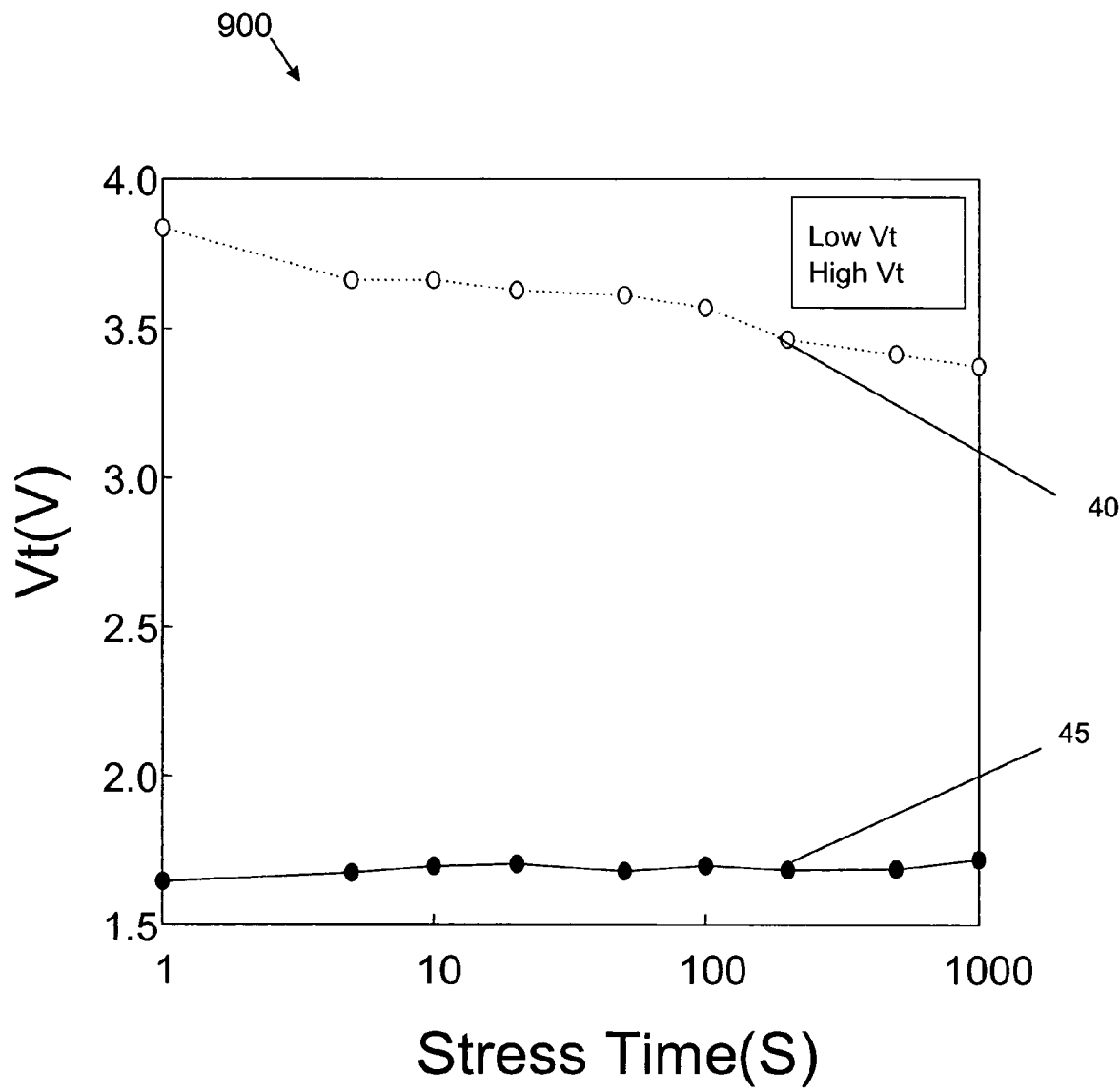
FIG. 9 is a graph showing experimental data that illustrates the threshold voltage shift after Vg stress at Vg=−5V for the memory structure of FIG. 3.

FIG. 9 is a graph 900 showing experimental data that compares the threshold voltage (Vt) shift (e.g., drift) versus a stress time for the control gate 145 stress and its effect on the data-side 165 after the 10,000 P/E cycle as shown in graph 700 of FIG. 7 for the Hybrid AC-memory cell 300 of FIG. 3. The control gate 145 is stressed with a bias potential of Vg=−5V for a stress time of 1,000 seconds and data for the threshold voltage window was observed. The low threshold voltage state 45 is the bottom data curve that is illustrated by the solid line with black circles, which remained generally constant over the 1,000 seconds of the stress time. The high threshold voltage state 40 is the top data curve that is illustrated by a dotted line with white circles, which shows about a 700 mV loss on the data-side 165 after the 1,000 seconds of the stress time. This illustrates that the Hybrid AC-memory 300 cell is sensitive to control gate 145 stress if the stress exists for a long time.

Figure 10:
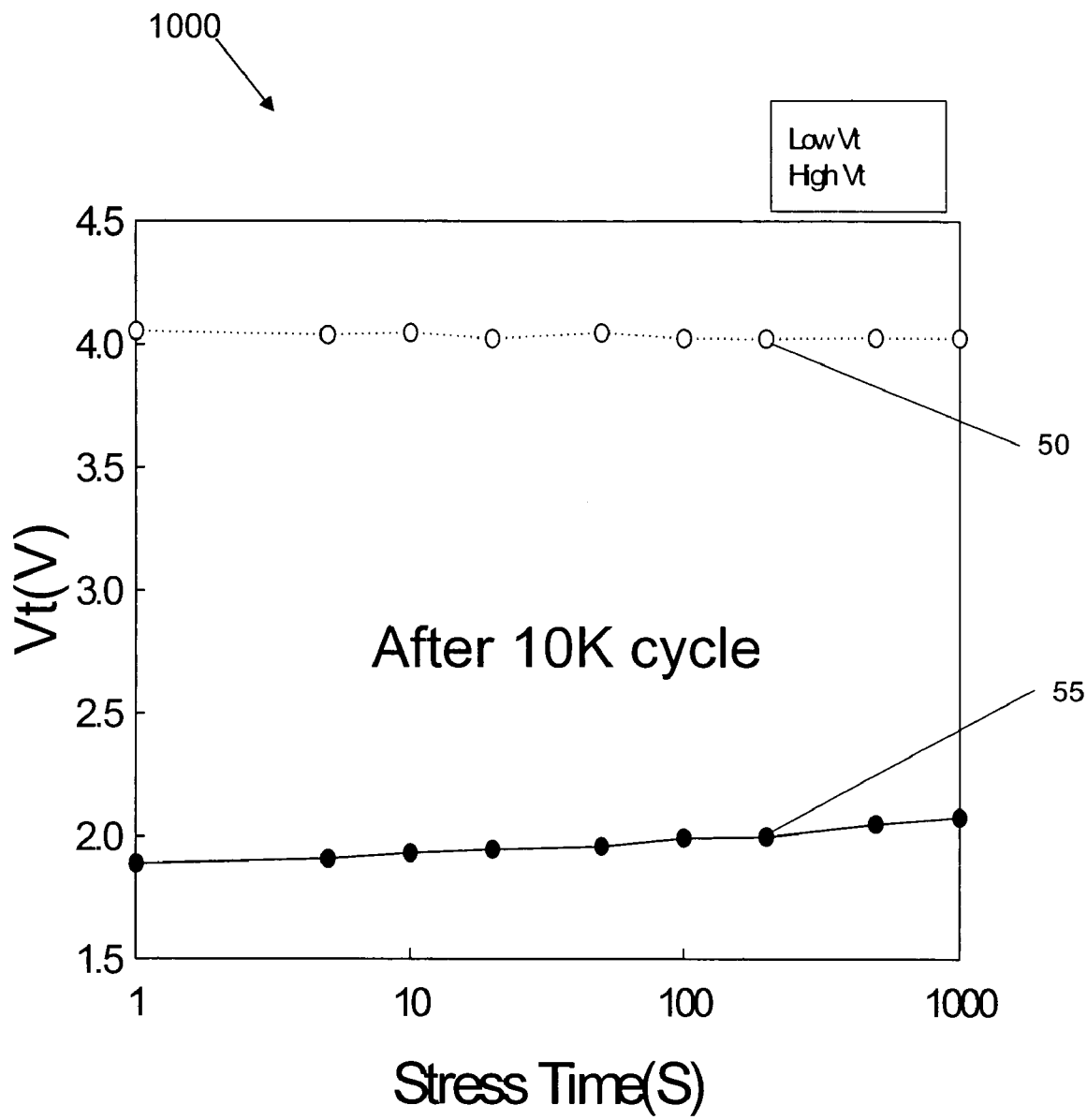
FIG. 10 is a graph showing experimental data that illustrates the threshold voltage shift after a read disturb test for the memory structure of FIG. 3.

FIG. 10 is a graph 1000 showing experimental data that compares the threshold voltage (Vt) shift versus stress time after a read disturbance test and its effect on the data-side 165 after the 10,000 program and erase cycle as shown in the graph 700 of FIG. 7 for the Hybrid AC-memory cell 300 of FIG. 3. The control gate 145 is supplied with a bias potential voltage of Vg=5V and the source 110 region is supplied with a bias potential voltage of Vs=1.6V, which is held for a stress time of 1,000 seconds. The low threshold voltage state 55 is the bottom data curve that is illustrated by the solid line with black circles and shows a 200 mV increase on the data-side 165 for the 1,000 seconds stress time. The high threshold voltage state 50 is the top data curve that is illustrated by a dotted line with white circles and remained generally constant for the 1,000 seconds of the stress time. As a result, the threshold voltage window is wider (e.g., larger ΔVt) at the beginning of the stress time and narrower (e.g., smaller ΔVt) at the end of the stress time.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of forming an assisted charge memory (AC-memory) cell comprising:
   (a) providing a charge trap memory cell including a two-sided charge trapping layer with a first side (AC-side) and a second side (data-side); and
   (b) forming a charge in at least a portion of the two-sided charge trapping layer,
   wherein the AC-side of the charge trapping layer always has a first threshold voltage (Vt) level which is fixed by the assisted charge for the AC-memory cell, and the data-side has a second threshold level, which is different from the first threshold voltage level and is used for memory programming, and wherein an abrupt electric field exists between the AC-side and the data-side.

2. The method of claim 1, wherein step (b) further comprises using one-side Channel Hot Electron (CHE) on the AC-side to establish the first threshold voltage (Vt) level, the second threshold being lower than the first threshold.

3. The method of claim 1 wherein the charge trapping layer is a nitride charge trapping layer.

4. A method of forming an assisted charge memory (AC-memory) cell in a charge trap memory device that performs a memory operation, the cell comprising (i) a p-type substrate, (ii) a source region in a portion of the substrate, (iii) a drain region in a portion of the substrate, (iv) a channel interposed between the source and drain regions and in a portion of the substrate, (v) a first dielectric layer on the substrate and above the channel, (vi) a two-sided charge trapping layer on the first dielectric layer, (vii) a second dielectric layer on the charge trapping layer, and (vii) a control gate above the second dielectric layer, the method comprising:
   (a) supplying a ground potential to the drain region;
   (b) supplying a bias potential voltage to the source region;
   (c) supplying a control voltage to the control gate; and
   (d) forming a charge in at least a portion of the two-sided charge trapping layer including a first side (AC-side) and a second side (data-side), wherein the AC-side has a first threshold voltage (Vt) level which is fixed by the assisted charge for the AC-memory cell, and the data-side has a second threshold level, which is different from the first threshold voltage level and is used for a memory operation, and wherein an abrupt electric field exists between the AC-side and the data-side.

5. The method of claim 4 wherein the memory operation is a read operation, and:
   step (a) further comprises supplying a ground potential to the drain region, and
   step (b) further comprises supplying a bias potential voltage to the source region, the method further comprising:
   (e) reading the data from only the data-side of the two-sided charge trapping layer.

6. The method of claim 5 wherein the memory operations of the two-sided charge trapping layer of the AC-memory are Multi-Level Cells, and the data-side can have a varying degree of charge level for the threshold voltage (Vt) level.

7. The method of claim 4 wherein step (d) uses a one-side Channel Hot Electron (CHE) on the AC-side to increase to the high threshold voltage (Vt) level, the data-side being at a low threshold voltage (Vt), wherein an abrupt electrical field region is created between the AC-side and the data-side in the channel between the drain and source regions, thereby forming a CHE AC-memory.

8. A method of forming an assisted charge memory (AC-memory) cell in a charge trap memory device that performs a memory operation, the cell comprising (i) a p-type substrate, (ii) a source region in a portion of the substrate, (iii) a drain region in a portion of the substrate, (iv) a channel interposed between the source and drain regions and in a portion of the substrate, (v) a first dielectric layer on the substrate and above the channel, (vi) a two-sided charge trapping layer on the first dielectric layer, (vii) a second dielectric layer on the charge trapping layer, and (vii) a control gate above the second dielectric layer, the method comprising:
   (a) supplying a ground potential to the drain region;
   (b) supplying a bias potential voltage to the source region;
   (c) supplying a control voltage to the control gate; and
   (d) forming a charge in at least a portion of the two-sided charge trapping layer, wherein the two-sided charge trapping layer includes a first side (AC-side) having a first threshold voltage (Vt) level which is the assisted charge for the AC-memory cell, and a second side (data-side) used for memory operations, wherein:
   step (a) further comprises supplying a ground potential to the drain region,
   step (b) further comprises supplying a bias potential voltage to the source region,
   step (d) uses one-side Channel Hot Electron (CHE) injection to increase to a fixed threshold voltage by forming the charge in the one side of the charge trapping layer, the charge being formed in the AC-side of the charge trapping layer, step (a) is repeated by removing the ground potential and supplying a bias potential voltage to the drain region, step (b) is repeated by removing the bias potential from the source and supplying a ground potential to the source, step (c) is repeated by changing the control voltage to a different control voltage, and step (d) uses Band-to-Band Hot-Hole (BTBHH) injection for erasing the data-side of the two-sided charge trapping layer of the AC-memory cell while maintaining the AC-side at a fixed high threshold voltage (Vt) level, wherein an abrupt electrical field region is created between the AC-side and the data-side in the channel between the drain and source regions, thereby forming a Hybrid AC-memory.

\* \* \* \* \*